(12) United States Patent
Yachi et al.

(10) Patent No.: US 6,404,108 B1
(45) Date of Patent: *Jun. 11, 2002

(54) PIEZOELECTRIC ACTUATOR

(75) Inventors: Masanori Yachi, Kawasaki; Noboru Wakatsuki, Ishinomaki; Sumio Yamada, Kawasaki, all of (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/219,367

(22) Filed: Dec. 23, 1998

(30) Foreign Application Priority Data

Jul. 15, 1998 (JP) .......................... 10-200691

(51) Int. Cl.[7] .............................. H01L 41/08
(52) U.S. Cl. .................. 310/330; 310/316.01; 310/332; 310/366
(58) Field of Search ................ 310/330–332, 310/348, 366, 370, 312, 316.01

(56) References Cited

U.S. PATENT DOCUMENTS

| 4,079,284 A | * | 3/1978 | Fanshawe ................... 310/348 |
| 4,193,010 A | * | 3/1980 | Kompanek ................... 310/330 |
| 4,377,765 A | * | 3/1983 | Kogure et al. ........... 310/366 X |
| 4,468,582 A | * | 8/1984 | Fujiwara et al. ............. 310/312 |
| 4,868,447 A | * | 9/1989 | Lee et al. ............... 310/366 X |
| 5,008,582 A | * | 4/1991 | Tanuma et al. ......... 310/330 X |
| 5,719,460 A | * | 2/1998 | Watarai et al. .......... 310/366 X |
| 5,862,431 A | * | 1/1999 | Christensen ............ 310/366 X |

OTHER PUBLICATIONS

Moving–Fiber Optical Switch Using LiNbO$_3$ Piezoelectric Actuator, FUJITSU, Sci. Tech. J., 27,4, pp. 369–378 (Dec. 1991).

* cited by examiner

Primary Examiner—Mark O. Budd
(74) Attorney, Agent, or Firm—Armstrong, Westerman & Hattori, LLP

(57) ABSTRACT

A piezoelectric actuator includes a main driver electrode 4 and a sensor electrode 5. A feedback signal is generated from the sensor electrode 5 in order to eliminate a primary vibration mode due to a primary resonance frequency. The main driver electrode extends to a fixture portion of the actuator, the fixture portion being fitted into a support member 11. The extending portion of the main driver electrode eliminates the electromechanical coupling against a secondary vibration mode due to a second resonance frequency. Features of the piezoelectric actuator suppress the resonance phenomenon, thus improving the response characteristics of the actuator.

15 Claims, 11 Drawing Sheets

○ MKR 719.010 Hz
MAG 241.704 K

PIEZOELECTRIC ACTUATOR

BACKGROUND OF THE INVENTION

A. Field of the Invention

The present invention relates to a piezoelectric actuator, and more particularly, to a piezoelectric actuator that includes driver electrodes formed on two opposing surfaces of a piezoelectric plate such that in response to an applied voltage, the piezoelectric plate is deformed into a curved or arcuate shape.

B. Description of the Related Art

In positioning of electronic microscopes, position control of a head in magnetic recording or optical recording, or in any electronic equipment that involves controlling movements or motion of an object, small sized actuators are required to rapidly control minute displacement.

As such actuators, generally, magnetic actuators have been used which combine windings and magnetic substances to generate and control displacement. Those magnetic actuators, however, require a large numbers of windings and a have complicated structures, suffering from a latent problem of being difficult to integrate into small devices. In addition, magnetic actuators often require a large current in high-speed operation due to a high inductive response in their components.

In place of magnetic actuator, piezoelectric actuators are sometimes used which have piezoelectric materials that are configured to undergo deformation from a generally planar or rectangular shape to an arcuate or curved shape in response to an applied voltage. The piezoelectric actuators are provided with electrodes in order to apply a voltage across opposing surfaces of a piezoelectric plate. The piezoelectric plate is made of two layers of semi-conducting piezoelectric porcelain or such piezoelectric ceramic as ferroelectric crystal, such that displacement occurs in one layer in a first direction, and in another layer in an opposite direction causing curvature in response to the applied voltage. In order to simplify the following descriptions of the related art and of the present invention, the above described displacement, where a rectangular member deforms to have a curved shape, will hereinafter be referred to as curving displacement.

The above piezoelectric actuators undergo curving displacement due to the transverse piezoelectric effects of piezoelectric materials employed in the two layers. The thin layers can be thin-sheet plates of piezoelectric material that are fixed to one another. Electrodes are formed on two opposing surfaces thereof. To obtain a large amount of displacement for an applied voltage, such thin-sheet plates may be provided in a laminated structure.

Such a lamination-structured piezoelectric actuator suffers from a problem in that only a small amount of displacement is realized as a result of an applied voltage. Typically, the applied voltage must be very large in many cases, requiring, for example, several hundreds of volts of applied voltage to provide several micrometers of displacement. In addition, the laminated structure is a complicated construction, which may result in a hysteresis effect in the displacement of joined portions of the piezoelectric plate.

There are also known bimorph type piezoelectric actuators, in which two piezoelectric plates are joined together to generate curving displacement in response to application of an electric field. The electric field causes the plate to expand in mutually opposite directions. In such bimorph type piezoelectric actuators, large amounts of displacement are expected for a given voltage. However, there is typically a hysteresis effect associated with the displacement at the joined portion between the two piezoelectric plates. In addition, in order to give large amounts of displacement in response to an applied voltage, the bimorph type piezoelectric actuators require piezoelectric plates that have a reduced thickness. The reduced thickness in turn give rise to problems associated with natural resonance frequency in the direction of curving displacement, in particular, undesirable resonance occurs in the form of pulse responses just after the electric field is applied and just after the electric field is removed. With this, the service frequency must be distant in value from the resonance frequency, giving rise to a problem of restrictions in service conditions. Also, when the piezoelectric plates are provided with viscosity to suppress the resonance phenomenon, the response characteristics may deteriorate.

The above-mentioned bimorph type piezoelectric actuators may suffer from a hysteresis effect after the electric field is applied such that the amount of displacement at the joined portions between the piezoelectric plates changes over an extended period of time. Further, at the same time, actuators made with minute ferroelectric crystal and other piezoelectric ceramic may suffer from domain state changes with changing voltages, so that there may be some hysteresis of the displacement vs. voltage characteristics latent in the piezoelectric plates themselves. Also, creep phenomenon, in which the displacement amount would change gradually even with a constant application voltage, has been found to be influenced by the manner in which the piezoelectric plates are joined.

By using reverse-polarized plates made of ferroelectric monocrystal such as lithium niobate ($LiNbO_3$) or lithium tantalate with inverted polarization directions near the center of the plate thickness, it is only possible to configure a bimorph type piezoelectric actuator by forming electrodes on each opposing surface. Such reverse-polarized plates made of ferroelectric monocrystal are able to obtain a large amount of displacement for a given applied voltage because of a large corresponding electromechanical coupling factor. Further, in such a device suppression of hysteresis and creep phenomenon is possible because there are no joined portions. They may have, however, resonance vibration having a large Q value in the direction of curving displacement. If such piezoelectric plates are used in an actuator structures, .undesirable resonance vibration may develop with respect to time-related changing drive voltage, giving rise undesirable resonance characteristics immediately after voltage changes, in particular, pulse response.

One solution to eliminate such an undesirable resonance phenomenon may be to provide sensor electrodes that detect amounts of displacement of the piezoelectric plates. The sensor electrodes should be separate from driver electrodes so that an output signal from the sensor electrodes may be fed back to a driving signal inputted to the driver electrodes. In the bimorph type piezoelectric actuators, it is possible to provide the main driver electrode on a. first surface and a ground electrode on a second surface that is opposite from the first surface, and sensor electrodes on the first surface separate from the main driver electrode.

Piezoelectric actuators utilizing piezoelectric plates with a thin-sheet plate configuration are known to have a natural resonance frequency in the curving displacement direction. Therefore, undesirable resonance phenomenon that may occur immediately after changes in pulse voltages is expectedly eliminated by feeding back an output signal from the above-mentioned sensor electrodes to the driving signal.

Those piezoelectric actuators, however, may sometimes suffer from a resonance phenomenon due to a secondary vibration mode in a higher harmonic different from that of a primary vibration mode that is caused by a primary resonance frequency of the piezoelectric plates. The secondary vibration mode is believed to be due to changes in the charge generation distributions that are caused by the asymmetry of the electrode geometry or the inclusion of the sensor electrodes themselves.

Therefore, if sensor electrodes are provided to suppress the primary vibration mode in the primary resonance frequency of the piezoelectric plates, the geometry of the sensor electrodes may have an influence on the geometry of the main driver electrode, giving rise to a resonance phenomenon due to a secondary vibration mode. The phenomenon is particularly highly expected when reverse-polarized plates are used which are made of ferroelectric monocrystal with a high Q value such as lithium niobate.

SUMMARY OF THE INVENTION

It is therefore an object of the present invention to provide a piezoelectric actuator with means to suppress the resonance phenomenon in the response characteristics of the actuator. In particular, it is desirable to suppress the secondary vibration mode corresponding to a second resonance frequency different from a first resonance frequency, in the direction of curving displacement.

In accordance with one aspect of the present invention, a piezoelectric actuator includes a piezoelectric element configured to undergo curving displacement in response to an applied driving signal. There are driver electrodes formed on opposing surfaces of the piezoelectric element, the driving signal being applied to the driver electrodes. Further, the piezoelectric actuator and electrodes are configured to eliminate electromechanical coupling that causes a primary vibration that is a result of a primary resonance frequency of the piezoelectric element. Further, the piezoelectric element and electrodes are configured to eliminate electromechanical coupling which causes a secondary vibration during curving displacement of the piezoelectric element as a result of a secondary resonance frequency, the primary and secondary resonance frequencies being different from one another.

Accordingly, the secondary vibration mode can be suppressed to improve the response characteristics of the piezoelectric actuator.

Preferably, the piezoelectric element includes two piezoelectric plates laminated together, the piezoelectric plates being oriented with reverse polarization with respect to one another.

Preferably, the piezoelectric plates of the piezoelectric element are each bimorph type piezoelectric plates.

Preferably, each of the piezoelectric plates are made of lithium niobate monocrystal that have a polarized orientation.

Preferably, the electrodes include a main driver electrode formed on a first surface of the opposing surfaces and a ground electrode provided in a second surface. of the opposing surfaces.

Preferably, the piezoelectric element is formed with a fixture portion at one end thereof in a longitudinal direction, the fixture portion being fixed to a support member.

Preferably, the main driver electrode extends to the fixture portion.

Preferably, the piezoelectric actuator further includes adjustment electrodes connected to the main driver electrode, the adjustment electrodes being formed in proximate the main driver electrode.

Preferably, the adjustment electrodes include a plurality of auxiliary driver electrodes configured for selective connection to the main driver electrode.

Preferably, the electrodes further include a sensor electrode configured to detect displacement and acceleration of the piezoelectric element in a direction corresponding to the curving displacement. The sensor electrode is formed on the first surface proximate the main driver electrode.

Preferably, the sensor electrode is formed on a central portion of the first surface of the piezoelectric element. The main driver electrode extends at least partially around the sensor electrode, and the sensor electrode and the main driver electrode are symmetrical with respect to a longitudinal centerline of the piezoelectric element.

Preferably, a second ground electrode is formed between the sensor electrode and the main driver electrode, the second ground electrode extending at least partially around the sensor electrode.

Preferably, a feedback circuit is connected to the electrodes, the feedback circuit being configured to suppress resonance in the primary vibration mode by providing a feedback signal from the sensor electrode to a driving signal inputted to the driver electrode.

Preferably, the feedback circuit includes a bandpass filter set for a frequency proximate the primary resonance frequency. The bandpass filter is inserted into the feedback circuit.

DETAILED DESCRIPTION OF THE PREFERRED EMBODIMENTS

Figure 1A:
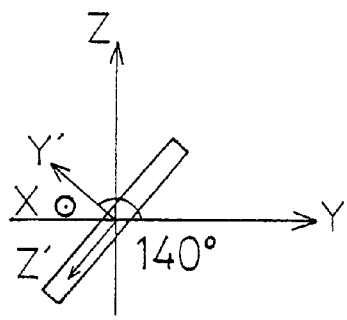
FIG. 1A is a diagram representing the crystal orientation, with respect to polarity, of a plate of lithium niobate monocyrstal in accordance with the present invention.
Figure 1B:
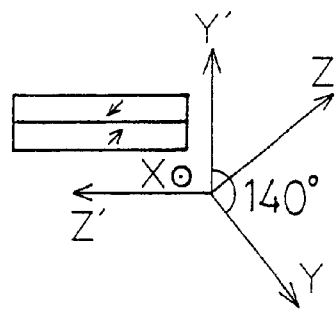
FIG. 1B is a diagram representing crystal orientation of a pair of reverse-polarized plates made of lithium niobate monocrystal making up a piezoelectric device in accordance with the present invention.
Figure 2:
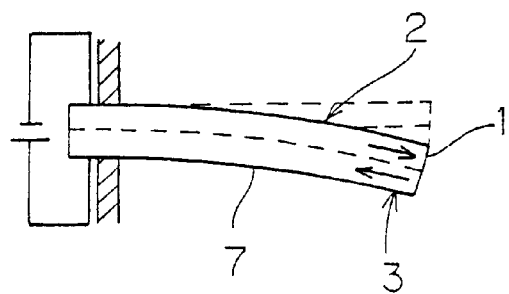
FIG. 2 is a schematic diagram showing a bimorph type piezoelectric actuator having the reverse-polarized plates represented in FIGS. 1A and 1B in accordance with the present invention.

According to the present invention, a bimorph type piezoelectric actuator includes two reverse-polarized plates made of lithium niobate monocrystal (LiNbO$_3$), each plate having a large electromechanical coupling factor. The reverse-polarized plates employed in the preferred embodiments of the present invention include lithium niobate monocrystal plates each having a crystal axis orientation such that the y-axis is turned by 140 degrees with respect to the x-axis, as shown in FIG. 1(a). Therefore, as shown in FIG. 1(b), the polarization direction of the two plates together are such that one plate is inverted with respect to the other in the direction of thickness. The plates are polarized as a result of, for example, heat treatment in the vicinity of the Curie point. Using such lithium niobate monocrystal reverse-polarized plates in such a way, a rectangular piezoelectric plate 1 is configured, as shown in FIG. 2. Electrodes may be formed on a first surface 2 and a second surface 3 opposite the first surface 2.

Figure 3:
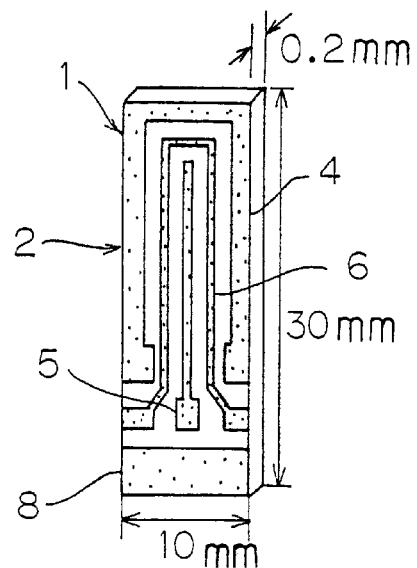
FIG. 3 is a perspective view showing one side of the piezoelectric actuator with electrodes formed thereon, in accordance with the present invention.

As shown in FIG. 3, a main driver electrode 4 is formed on the first surface 2 of the piezoelectric plate 1. A driving signal is applied to the main driver electrode 4. A sensor electrode 5 which detects amounts of displacement is also formed on the first surface 2 along with a ground electrode 6. The ground electrode 6 is extends around the sensor electrode 5 and between portions of the main driver electrode 4. Also, a thin metal film 8 is supported and fixed by soldering to the lower end of the first surface 2. The second surface 3, opposite the first surface 2 of the piezoelectric plate 1, is in FIG. 2 and includes a ground electrode 7 and is grounded electrically during usage. In the embodiment shown, the piezoelectric plate 1 measures 0.2 mm in thickness, 10 mm in width, and 30 mm in height.

Figure 4:
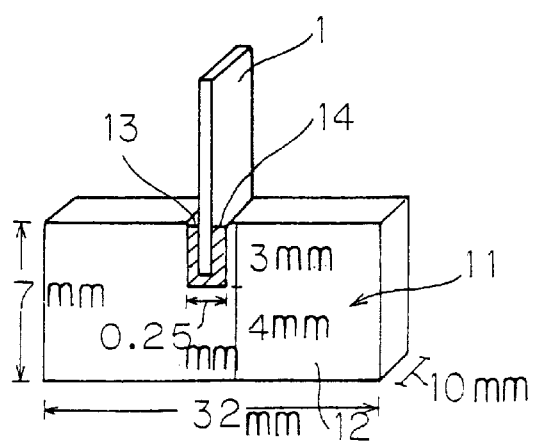
FIG. 4 is a perspective view of the piezoelectric actuator mounted in a support block in accordance with the present invention.

The above-mentioned piezoelectric plate 1 is fixed and supported in a support member 11 as shown in FIG. 4. The support member 11 has a fixture groove 13 formed in a metal block 12 made of, for instance, brass, into which the piezoelectric plate 1 is inserted. A metallized layer 14 formed by plating nickel, or other metals, is provided on the surfaces of the fixture groove 13. The support member 11 in a preferred embodiment measures 32 mm in thickness (in the direction of the thickness of the piezoelectric plate 1), 10 mm in width, and 7 mm in height. The fixture groove 13 measures 3 mm in depth and 0.25 mm in width. With this, the metallized layer 14 is predefined to be about 0.05 mm in thickness. The lower end of the piezoelectric plate 1 is inserted and soldered into the fixture groove 13.

Figure 5A:
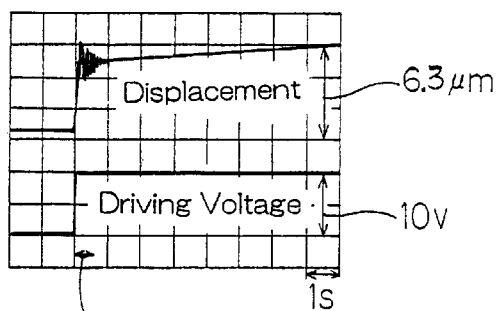
FIG. 5A is a graph showing a voltage pulse that is inputted into the piezoelectric actuator, and showing a displacement response of the piezoelectric actuator.

In the above-mentioned bimorph type actuator provided with the electrodes in the piezoelectric plate 1, the piezoelectric plate 1 experiences a resonance vibration when undergoing displacement at the extremities of a response curve representing movement thereof. As shown in FIG. 5A, when a step-wise signal with a potential difference of 10V (lower portion of FIG. 5A) is applied as a driving signal to the piezoelectric plate 1, a resonance vibration is observed in a leading portion of the displacement curve (upper portion of in FIG. 5A). The leading portion of the displacement curve in FIG. 5A is enlarged in FIG. 5B.

Figure 5B:
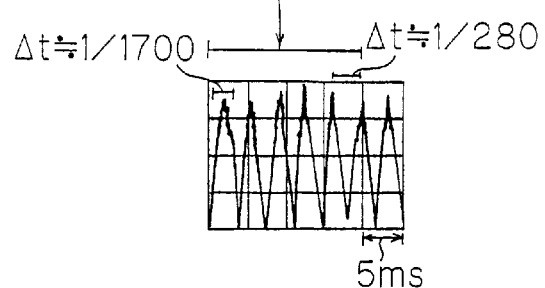
FIG. 5B is a graph. showing a section of the displacement response of the piezoelectric actuator depicted in FIG. 5A, on an enlarged scale.

As can be determined from an analysis of FIG. 5B, the resonance vibration given immediately after the change in applied voltage is a combination of a vibration in a primary vibration mode (corresponding to a primary resonance frequency) having a period of 1/280, and a vibration in a secondary vibration mode (corresponding to a secondary resonance frequency) having a period of 1/1700.

Figure 6:
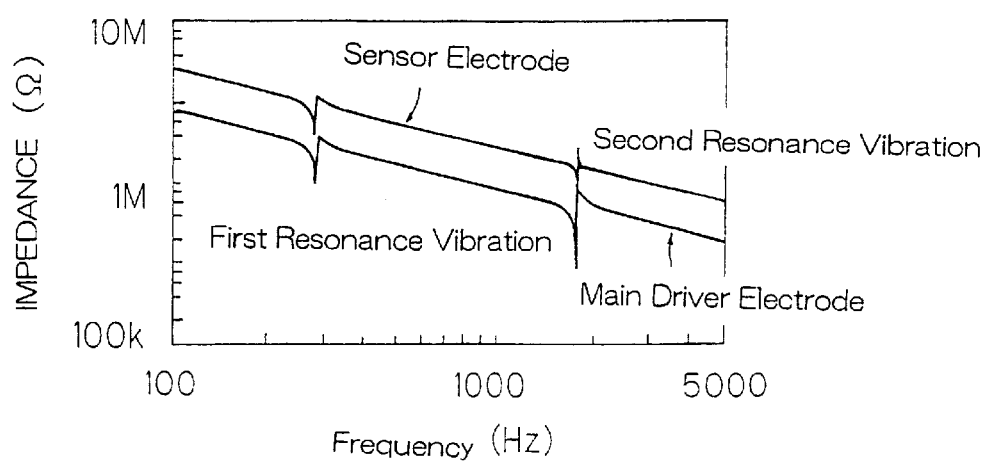
FIG. 6 is a graph showing impedance characteristics of a driver electrode and a sensor electrode of the electrodes depicted in FIG. 3.

FIG. 6 shows the frequency characteristics of the input impedance of each of the main driver electrode 4 and the sensor electrode 5 of the piezoelectric plate 1. As can be seen in FIG. 6, both the main driver electrode 4 and the sensor electrode 5 have drop peaks of the input impedance near frequencies of 280 Hz and 1700 Hz, supporting the resonance vibration shown in FIG. 5.

Figure 7:
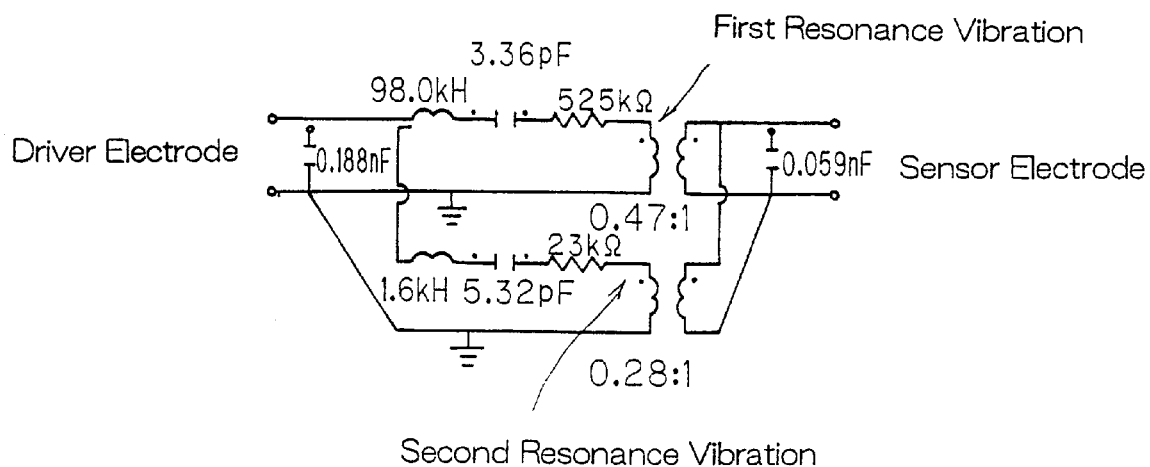
FIG. 7 is a schematic diagram showing an equivalent circuit that exhibits the impedance responses of the driver electrode and the sensor electrode.
Figure 8:
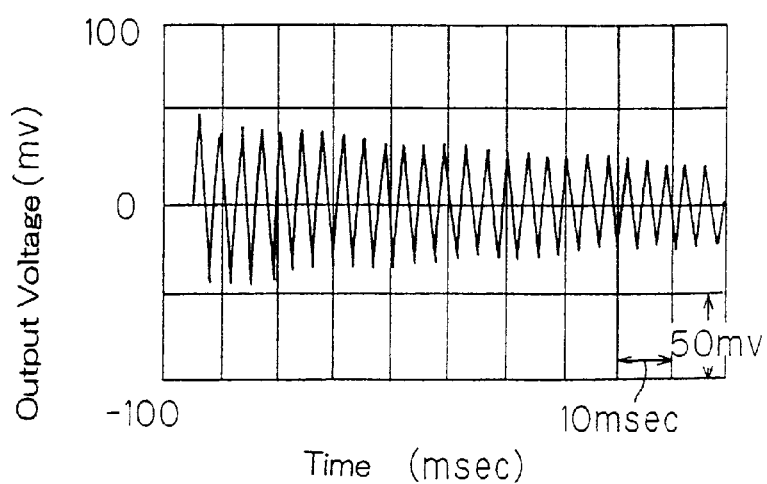
FIG. 8 is a graph showing an output waveform representing a pulse response of the circuit of FIG. 7.

Equivalent circuits of the above-mentioned piezoelectric actuator are considered below. Both an equivalent circuit of a piezoelectric actuator, as viewed from the main driver electrode 4, and that as viewed from the sensor electrode 5, have a mechanical vibration portion that coincide. The inventors have modeled an ideal transformer that provides almost identical responses with respect to the mechanical vibrations from the above electrodes shown in the curves in FIG. 6 by, for instance, using serial L, C, and R elements. Such an equivalent circuit is constructed with respect to the main driver electrode 4 and with respect to the sensor electrode 5. An equivalent circuit of the piezoelectric actuator is shown in FIG. 7. The equivalent circuit closely reproduces responses to both the primary and secondary vibration modes of the piezoelectric actuator. FIG. 8 is similar to FIG. 5B and shows on an enlarged scale the response of the equivalent circuit immediately after the step-wise increase in voltage (similar to FIG. 5B). The response shown in FIG. 8 coincides almost exactly with the displacement characteristics of the tip of the above-mentioned piezoelectric plate 1.

Figure 9:
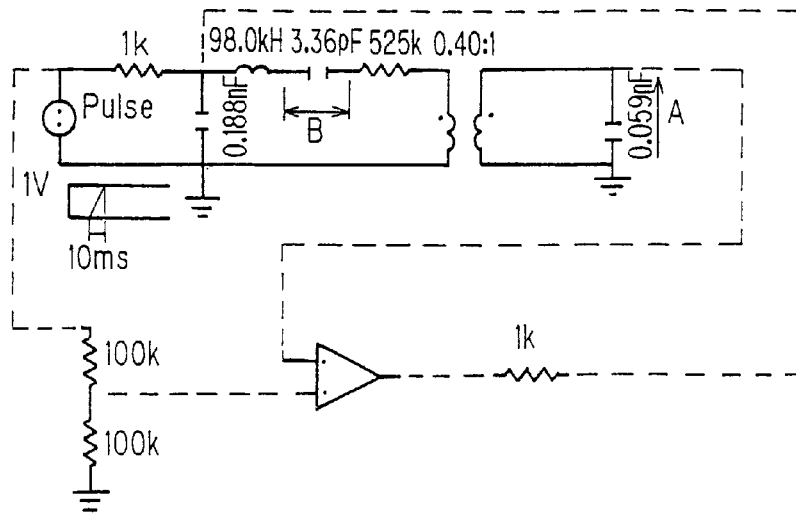
FIG. 9 is a circuit diagram showing a DC feedback circuit using an operational amplifier that models portions of the response from piezoelectric actuator.

In the piezoelectric actuator in accordance with the present invention, the resonance vibration resulting from the primary vibration mode (at the primary resonance frequency) can be suppressed by providing a feedback signal from an output of the sensor electrode 5 to the main driver electrode 4. FIG. 9 shows a circuit in which an ideal operational amplifier is used to provide a feedback signal from the output of the sensor electrode 5 to the main driver electrode 4 in a circuit similar to the circuit shown in FIG. 7. The circuit shown in FIG. 9 provides a feedback signal that takes voltage differences into account between the output voltage of the sensor electrode and a reference voltage including DC components, thus realizing the arbitrary waveforms.

Figure 10A:
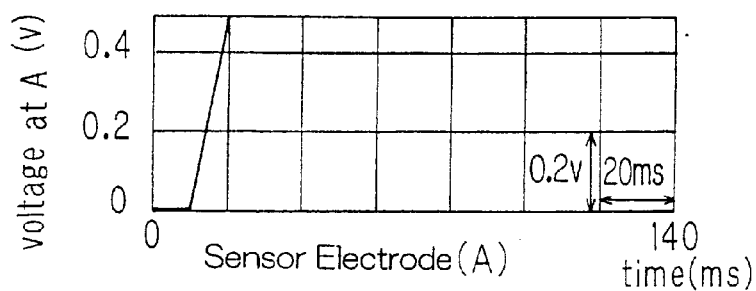
FIGS. 10A and 10B are graphs of output waveforms showing a pulse response of the circuit of FIG. 9.
Figure 10B:
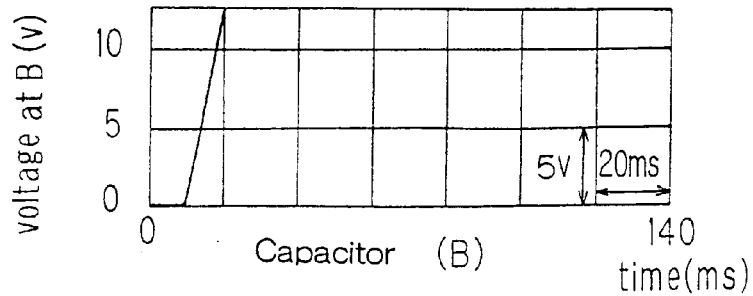

Simulation results obtained by using the circuit depicted in FIG. 9, are illustrated in FIGS. 10A and 10B. FIG. 10A shows the response a sensor electrode A of the circuit depicted in FIG. 9. FIG. 10B shows the response at a capacitor B. It was, however, difficult to conduct experimental confirmation because the DC components were amplified and largely dependent on the input impedance of the operational amplifier. Therefore, further considerations are necessary.

Figure 11:
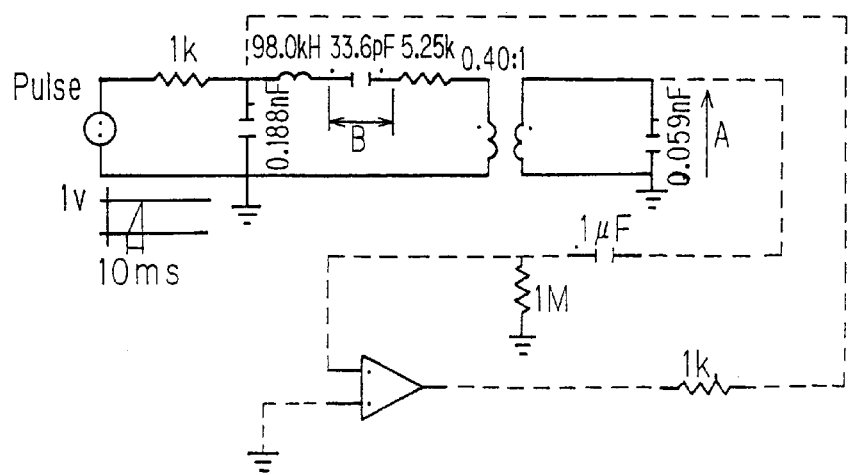
FIG. 11 is a circuit diagram showing an AC feedback circuit using an operational amplifier in order to model portions of the responses from the piezoelectric actuator.
Figure 12A:
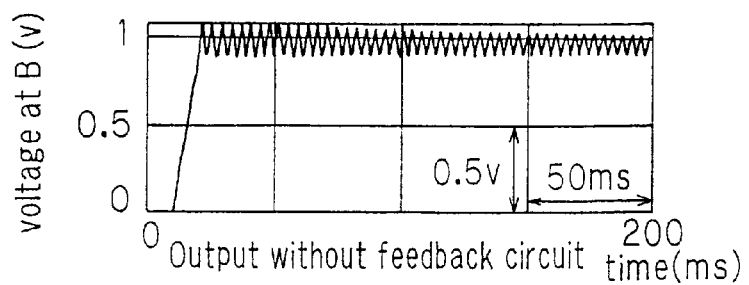
FIGS. 12A and 12B are graphs showing output waveforms representing pulse responses of portions of the circuit depicted in FIG. 11.
Figure 12B:
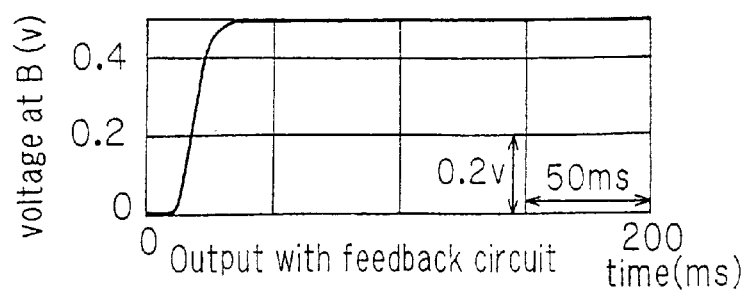

Now, a case is considered where a circuit provides a feedback signal of only AC components, the circuit being shown in FIG. 11. This circuit is designed to selectively suppress the resonance vibration that contributes to undesirable resonance phenomenon. Based on an analysis of the equivalent circuit, the output of the sensor electrode 5 is inverted near the resonance frequency in both the primary and secondary vibration modes, thus suppressing the resonance phenomenon in both the primary and the secondary vibration mode by a circuit that conducts a negative feedback signal from the output to an amplifier. If no band-pass filter is inserted, however, the circuit vibrates as shown in FIG. 12(a). Therefore, as shown in FIG. 13, by inserting a band-pass filter 100 on the output side of the sensor electrode 5 (labeled S in FIG. 13) of the actuator, providing a phase circuit 101 for adjustment, and applying an inverted-phase voltage via a charge amplifier to the main driver electrode 4 (labeled D in FIG. 13), it is possible to obtain such a waveform as shown in FIG. 12(b).

Figure 13:
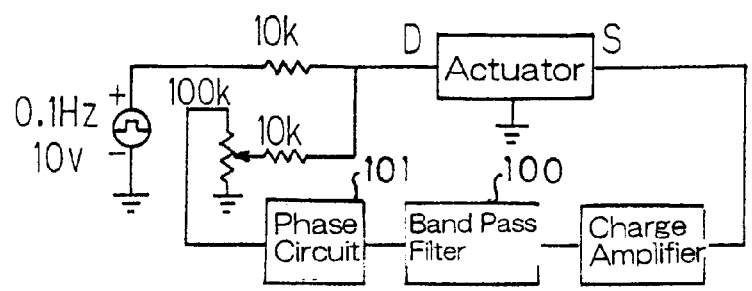
FIG. 13 is a block diagram representing a circuit used to test aspects of the present invention.
Figure 14A:
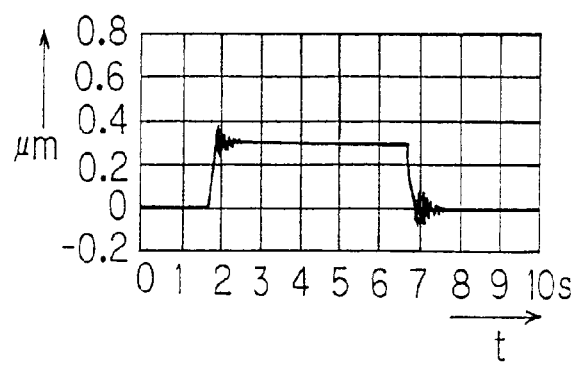
FIGS. 14A and 14B are graphs showing output waveforms representing pulse responses of the circuit of FIG. 13.
Figure 14B:
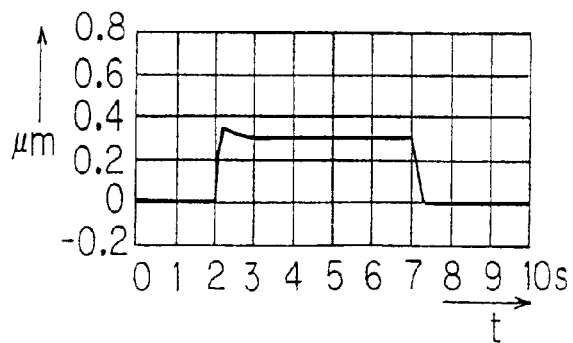

FIG. 14 shows results in the case where a displacement amount was measured at the tip of the piezoelectric plate i with an optical displacement meter where the circuit as shown in FIG. 13 is applied to the above-mentioned piezoelectric actuator, to apply a pulse-wise drive voltage to the actuator. FIG. 14A shows the displacement response in the case where no feedback signal from the output of the sensor electrode 5 was provided and FIG. 14B shows the displacement response in the case where a feedback signal from the sensor electrode 5 was provided. These two figures show in combination that an undesirable resonance phenomenon in the primary vibration mode can be suppressed by providing a feedback signal from the sensor electrode to the driver electrode.

Figure 15A:
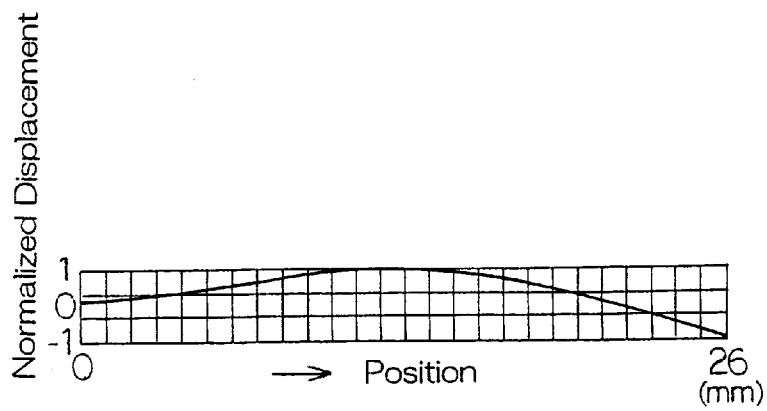
FIGS. 15A and 15B are graphs showing displacement distribution and a charge distribution, respectively, of an example where electrodes are provided all over a piezoelectric plate.
Figure 15B:
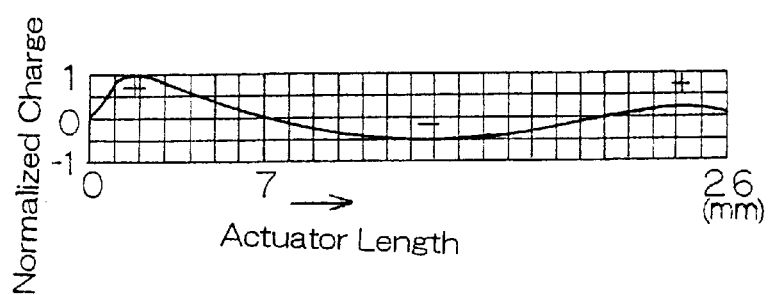

FIGS. 15A and 15B shows the results a finite-element analysis of the displacement distribution and the charge distribution, respectively, in the longitudinal direction of a piezoelectric acutator. In the piezoelectric actuator, electrodes were provided on opposing surfaces 2 and 3 two reverse-polarized plates made of lithium niobate monocrystal. One end of the piezoelectric actuator was fixed, as shown in FIG. 4. FIG. 15A shows the distribution of a normalization displacement amount (y-axis) vs. the longitudinal direction position of the actuator (x-axis). FIG. 15B shows a distribution of a normalization charge quantity (y-axis) vs. the longitudinal direction position of the actuator (x-axis).

Figure 16A:
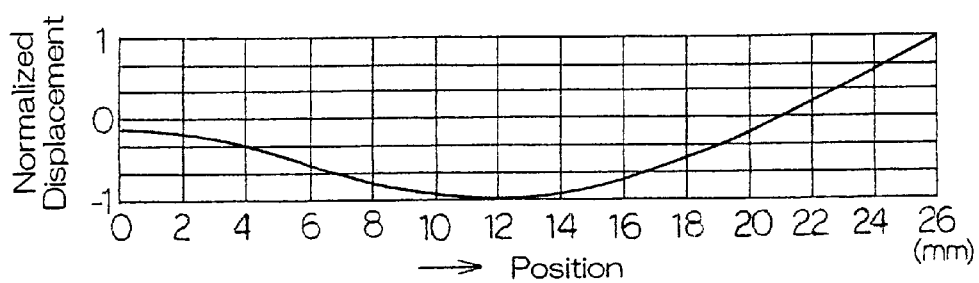
FIGS. 16A and 16B are graphs showing displacement distribution and charge distribution of an example where the geometry of a driver electrode is modified in accordance with the present invention.
Figure 16B:
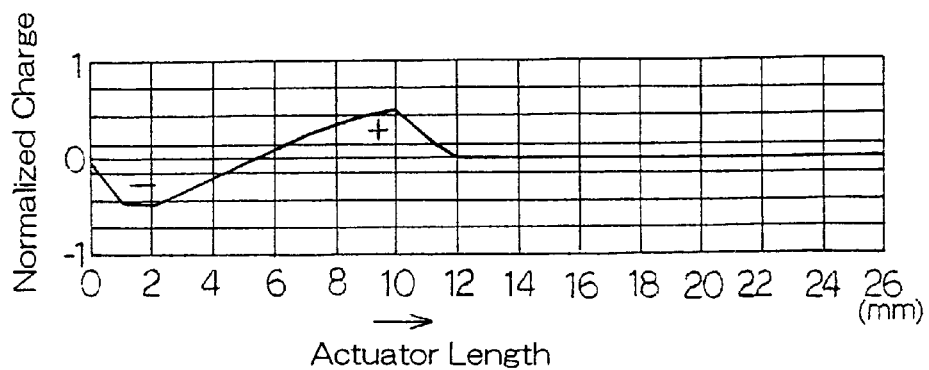

As seen from the charge distribution, it is possible to reduce an electromechanical coupling factor to zero and suppress the secondary vibration mode by arranging the electrodes in such a way as to reduce the total of charges to zero in correspondence with occurrence distributions of charges with different polarities. The electrodes may be configured such that the amount of displacement and the charge quantity determined along the actuator's length may be as shown in FIGS. 16A and 16B respectively, and therefore, it should be possible to suppress an undesirable resonance phenomenon in the secondary vibration mode.

Figure 17:
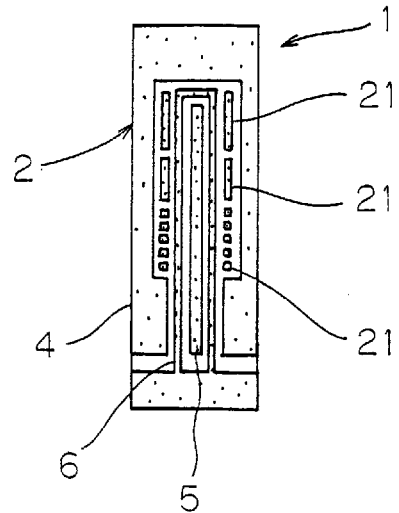
FIG. 17 is a front view of a piezoelectric actuator with a main electrode and a sensor electrode formed thereon, and further having an array of auxiliary driver electrodes formed thereon in accordance with the present invention.

The inventors conducted an experiment of a method for measuring and adjusting the actual electromechanical coupling factor of a piezoelectric actuator. In the piezoelectric actuator, the ground electrode 6 was disposed between the main driver electrode 4 and the sensor electrode 5, with the ground electrode 6 surrounding the sensor electrode 5 (as shown in FIG. 17). A plurality of auxiliary driver electrodes 21 connectable to the main driver electrode 4 were provided between portions of the main driver electrode 4 and the ground electrode 6. The auxiliary driver electrodes 21 were etched such that they are separated from the main driver electrode 4 but can be selectively connected therewith, as desired.

Figure 18:
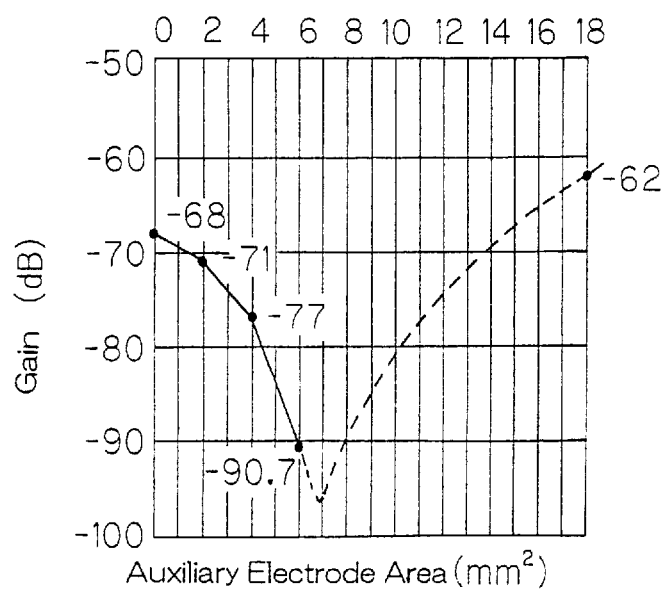
FIG. 18 is a graph showing a representation of the relationship between increases in the surface area of the auxiliary driver electrodes in FIG. 17 and the output of the sensor electrode in FIG. 17.

FIG. 18 shows the results of measurements of the resonance phenomenon of the secondary vibration mode occurring at the sensor electrode 5 while changing the geometry of the main driver electrode 4 by appropriately connecting the auxiliary driver electrodes 21 to the main driver electrode 4. The x-axis of FIG. 18 represents the total surface area of the connected portions of the auxiliary driver electrodes 21. As can be seen from the curve in FIG. 18, the output of the sensor electrode 5 caused by a resonance phenomenon in the secondary vibration mode decreases as the area of the auxiliary driver electrodes 21 connected to the main driver electrode 4 increases. However, if an added area of the auxiliary driver electrodes 21 exceeds a prescribed value of area, the output of the sensor electrode 5 deteriorates as the resonance phenomenon in the secondary vibration mode increases again. Therefore, by setting an added area of the main driver electrode 4 when auxiliary driver electrodes 21 are connected in such a way as to minimize the output of the sensor electrode 5, it is possible to suppress the resonance phenomenon in the secondary vibration mode.

Figure 19:
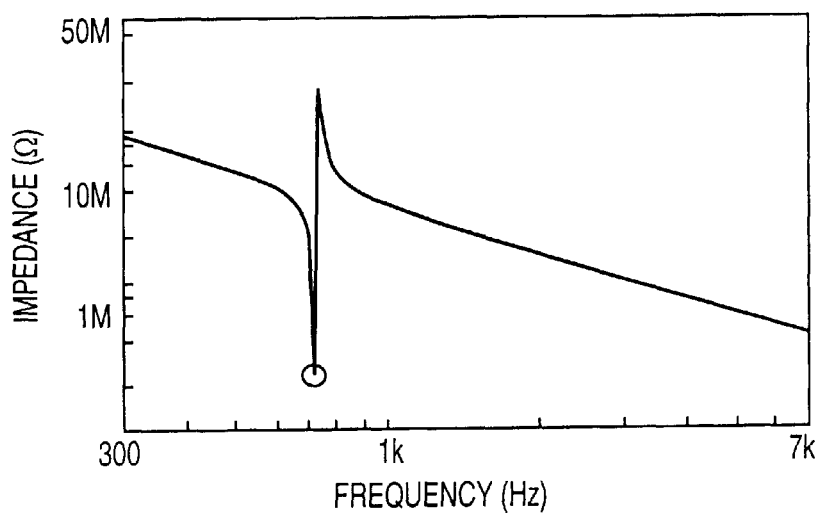
FIG. 19 is a graph showing impedance characteristics of an ideal electrode geometry.

FIG. 19 shows the results of measuring the frequency characteristics of the input impedance of the driver electrodes when auxiliary driver electrodes 21 connected to the main driver electrode 4 are adjusted so as to minimize the resonance phenomenon in the secondary vibration mode. The curve in FIG. 19 shows that the resonance phenomenon in the secondary vibration mode can be suppressed and that the resonance phenomenon in the primary vibration mode may be eliminated providing a good displacement response. The primary vibration mode is similar to a static displacement distribution, showing that the characteristics of the actuator have not deteriorated as a result of the added features.

By providing a plurality of auxiliary driver electrodes 21 in the vicinity of the main driver electrode 4 and connecting them together, it is possible to provide a configuration to suppress the secondary vibration mode.

Specific details of a first embodiment of the present invention are described below.

Figure 20:
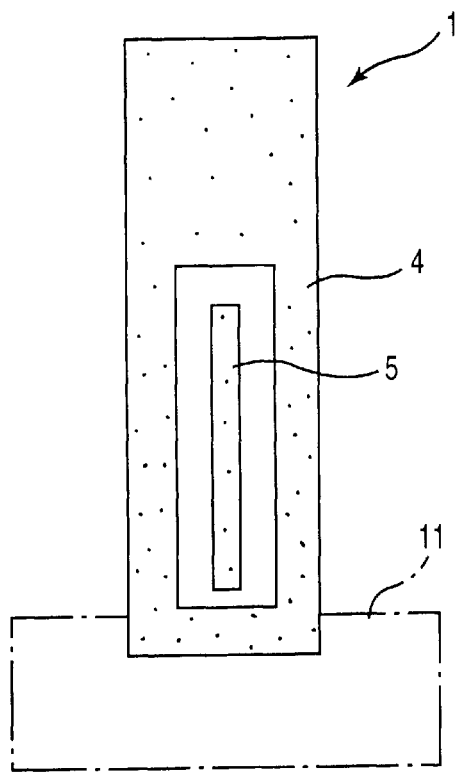
FIG. 20 is a front view of a piezoelectric actuator with an arrangement of driver electrodes in accordance with a first embodiment of the present invention.

When piezoelectric plates 1 are fixed in a support member 11 as shown in FIG. 4, the maximum charging occurs near a base or fixture portion proximate the support member 11. Therefore, imbalance problems in charge occur at the fixture portion due to a shift in positioning of the overall electrode pattern. This phenomenon is shown in the responses depicted in FIG. 15B. In a first embodiment shown in FIG. 20, in consideration of a charge balance near the fixture portion, a main driver electrode 4 extends up from the vicinity of the fixture portion and the support member 11 of the piezoelectric plate 1. In this case, the charge near the fixture portion in the secondary vibration mode can be offset, to suppress the resonance phenomenon in the secondary vibration mode.

In the first embodiment, a sensor electrode 5 is arranged at the intermediate position in the width direction (horizontal direction in FIG. 20) of the piezoelectric plate 1 and the main driver electrode 4 is formed horizontally symmetrical around the sensor electrode 5. Thus, any torsional vibration due to the asymmetry of the electrodes should cancel out to eliminate any undesirable resonance vibration.

Figure 21:
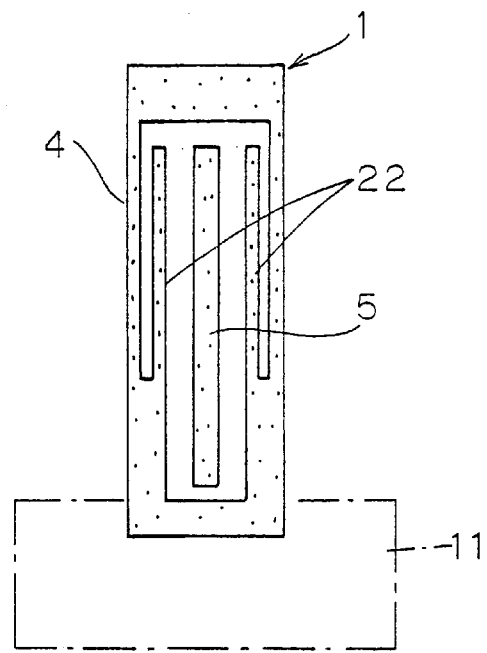
FIG. 21 is a front view of a piezoelectric actuator with an arrangement of driver electrodes in accordance with a second embodiment of the present invention.

A second embodiment depicted in FIG. 21, incorporates the geometry of the auxiliary driver electrodes 21 in FIG. 17 into the geometry of an adjustment electrode 22 connected to the main driver electrode 4. With this arrangement, the main driver electrode 4 is configured to minimize the output of the sensor electrode 5 in the second vibration mode.

In this embodiment, the adjustment electrode 22 serves to eliminate an unbalance of charge in the secondary vibration mode, to suppress an undesirable resonance phenomenon.

In this embodiment, as in the first embodiment, the sensor electrode 5 is centrally disposed along the length of the surface of the piezoelectric plate 1 so that the main driver electrode 4 and the adjustment electrode 22 may be horizontally symmetrical with respect to one another. With this arrangement, vibration is suppressed due to the symmetry of the electrodes.

Figure 22:
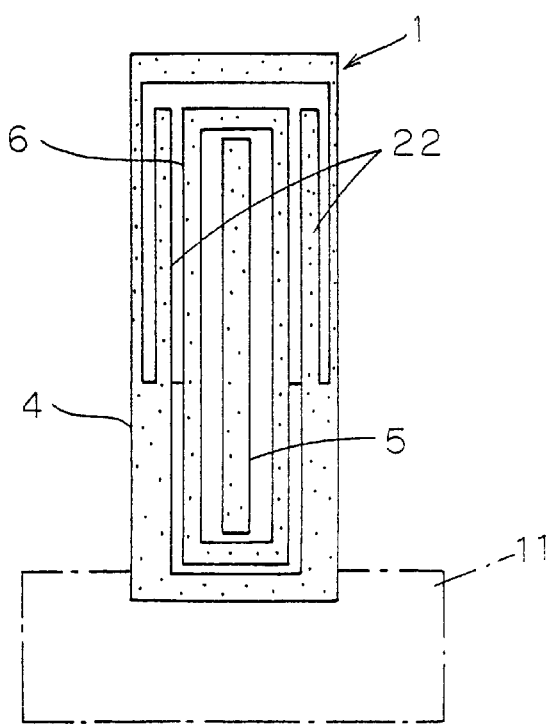
FIG. 22 a front view of a piezoelectric actuator that includes driver electrodes in accordance with a third embodiment of the present invention.

A third embodiment of the present invention is depicted in FIG. 22. In the third embodiment, the general configuration of the electrodes in the second embodiment in FIG. 21 is modified to accommodate a ground electrode 6 that is disposed between portions of the main driver electrode 4 and the sensor electrode 5 as shown in FIG. 22. As is depicted, the ground electrode 6 surrounds the sensor electrode 5. In this case, it is possible to eliminate any electromagnetic coupling between the main driver electrode 4 and the sensor electrode 5, thus obtaining more stable operations.

As in the first and second embodiments, the third embodiment includes the sensor electrode 5 at a central portion of the piezoelectric plate 1, with respect to the width thereof. Further, the main driver electrode, the ground electrode 6 and the adjustment electrode 22 are horizontally symmetrical with respect to the sensor electrode 5 therebetween.

In a fourth embodiment, it is also possible to provide a plurality of auxiliary driver electrodes 21, as in FIG. 17, and selectively connect them to a main driver electrode 4. Selectively connecting the auxiliary driver electrodes 21 to the main driver electrode 4 allows for precise suppression of the secondary vibration mode.

In this case, by forming the main driver electrode 4 and the auxiliary driver electrodes 21 in a horizontally symmetrical arrangement, and also selectively connecting the main driver electrode 4 with some of the auxiliary driver electrodes 21 in a horizontally symmetrical manner, it is possible to eliminate possible vibrations that might occur due to asymmetry of the electrodes.

Some of the effects of the invention are described below.

The present invention can provide a driver electrode with a configuration to eliminate the electromechanical coupling due to the secondary vibration mode, to suppress an undesirable resonance vibration due to the secondary vibration mode, thus configuring a piezoelectric actuator with favorable displacement response in pulse response.

What is claimed is:

1. A piezoelectric actuator, comprising:
   a piezoelectric element formed as a thin longitudinal plate having main opposing surfaces configured to undergo curving displacement in response to an applied driving signal;
   driver electrodes formed on opposing surfaces of said piezoelectric element, the driving signal being applied to said driver electrodes;
   a sensor electrode provided on one of the opposing surfaces for detecting displacement in said piezoelectric element, wherein one of said driver electrodes is in a predetermined configuration with respect to said sensor electrode; and
   an electrical feedback circuit connected to said sensor electrode and one of said driver electrodes for providing a feedback signal from said sensor to the one of said driver electrodes to eliminate electromechanical coupling which causes a primary vibration that is a result of a primary resonance frequency of the piezoelectric element; wherein
   said sensor electrode is disposed near the longitudinal center of the piezoelectric plate, and
   said predetermined configuration disposes said one of said driver electrodes such that it is axially symmetrical with respect to the longitudinal center of piezoelectric plate, and is predetermined so as to eliminate electromechanical coupling which causes secondary vibration during curving displacement of said piezoelectric element as a result of a secondary resonance frequency, the primary and secondary resonance frequencies being different from one another by setting the area distribution in the longitudinal direction in said secondary vibration mode so that the total charge of + charge and − charge which occurs in said actuator is reduced to zero.

2. The piezoelectric actuator as set forth in claim 1, wherein said piezoelectric element comprises two piezoelectric plates laminated together, said piezoelectric plates being oriented with reverse polarization with respect to one another.

3. The piezoelectric actuator as set forth in claim 2, wherein each of said piezoelectric plates are made of lithium niobate monocrystal that have a polarized orientation.

4. The piezoelectric actuator as set forth in claim 3, wherein said electrodes comprises:
   a main driver electrode formed on a first surface of said opposing surfaces; and
   a ground electrode provided in a second surface of said opposing surfaces.

5. The piezoelectric actuator as set forth in claim 4, wherein piezoelectric element is formed with a fixture portion at one end thereof in a longitudinal direction, said fixture portion being fixed to a support member.

6. The piezoelectric actuator as set forth in claim 5, wherein said main driver electrode extends to said fixture portion.

7. The piezoelectric actuator as set forth in claim 5, further comprising adjustment electrodes connected to said main driver electrode, said adjustment electrodes being formed in proximate said main driver electrode.

8. The piezoelectric actuator as set forth in claim 7, wherein said adjustment electrodes comprise a plurality of auxiliary driver electrodes configured for selective connection to said main driver electrode.

9. The piezoelectric actuator as set forth in claim 4, wherein said electrodes further comprise a sensor electrode configured to, detect displacement and acceleration of the piezoelectric element in a direction corresponding to the curving displacement, said sensor electrode being formed on said first surface proximate said main driver electrode.

10. The piezoelectric actuator as set forth in claim 9, wherein said sensor electrode is formed on a central portion of said first surface of said piezoelectric element, and said main driver electrode extends at least partially around said sensor electrode, and said sensor electrode and said main driver electrode are symmetrical with respect to a longitudinal centerline of said piezoelectric element.

11. The piezoelectric actuator as set forth in claim 9, wherein a second ground electrode is formed between said sensor electrode and said main driver electrode, said second ground electrode extending at least partially around said sensor electrode.

12. The piezoelectric actuator as set forth in claim 11, further comprising a feedback circuit connected to said electrodes, said feedback circuit being configured to suppress resonance in the primary vibration mode by providing a feedback signal from said sensor electrode to a driving signal inputted to said driver electrode.

13. The piezoelectric actuator as set forth in claim 12, wherein said feedback circuit comprises a band-pass filter set for a frequency proximate said primary resonance frequency, said bandpass filter being inserted into said feedback circuit.

14. The piezoelectric actuator as set forth in claim 4, wherein said piezoelectric element includes a body portion and a mounting portion, said mounting portion configured for mounting in a fixture groove in a support member, a thin metal layer being formed on a surface of said mounting portion corresponding to said first surface, and said main driver electrode extends to proximate said mounting portion.

15. A piezoelectric actuator, comprising:

a piezoelectric element formed as a thin plate having main opposing surfaces configured to undergo curving displacement in response to an applied driving signal, said piezoelectric element including a body portion and a mounting portion, said mounting portion configured for mounting in a fixture groove in a support member, and a first surface of said mounting portion being formed with a thin metal layer;

a main driver electrode formed on a first surface of said opposing surfaces by setting the area distribution in the longitudinal direction in said secondary vibration mode so that the total charge of + charge and – charge which occurs in said actuator is reduced to zero, a ground electrode provided on a second surface of said opposing surfaces, said main driver electrode extending to proximate said mounting portion;

a sensor electrode provided on one of the opposing surfaces for detecting displacement in said piezoelectric element, wherein one of said driver electrodes is in a predetermined configuration with respect to said sensor electrode; and electrical feedback means circuit connected to said sensor electrode and one of said driver electrodes for signal feedback from said sensor to the one of said driver electrodes to eliminate electromechanical coupling which causes a primary vibration that is a result of a primary resonance frequency of the piezoelectric element; wherein said predetermined configuration is predetermined so as to eliminate electromechanical coupling which causes secondary vibration during curving displacement of said piezoelectric element as a result of a secondary resonance frequency, the primary and secondary resonance frequencies being different from one another.

\* \* \* \* \*